United States Patent
Koduri (10) Patent No.: US 11,444,048 B2
(45) Date of Patent: Sep. 13, 2022

(54) SHAPED INTERCONNECT BUMPS IN SEMICONDUCTOR DEVICES

(71) Applicant: TEXAS INSTRUMENTS INCORPORATED, Dallas, TX (US)

(72) Inventor: Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 479 days.

(21) Appl. No.: 16/103,839

(22) Filed: Aug. 14, 2018

(65) Prior Publication Data
US 2019/0109110 A1   Apr. 11, 2019

Related U.S. Application Data

(60) Provisional application No. 62/568,330, filed on Oct. 5, 2017, provisional application No. 62/568,331, filed (Continued)

(51) Int. Cl.
*H01L 23/00* (2006.01)
*H01L 23/31* (2006.01)
(Continued)

(52) U.S. Cl.
CPC .......... *H01L 24/16* (2013.01); *H01L 21/4828* (2013.01); *H01L 21/565* (2013.01); *H01L 23/3114* (2013.01); *H01L 23/3121* (2013.01); *H01L 23/3157* (2013.01); *H01L 23/495* (2013.01); *H01L 23/49541* (2013.01); *H01L 23/49548* (2013.01); *H01L 23/49558* (2013.01);
(Continued)

(58) Field of Classification Search
CPC ......... H01L 2224/1703; H01L 23/488–49894; H01L 2224/14163; H01L 2224/1403; G02F 2001/13398
See application file for complete search history.

(56) References Cited

U.S. PATENT DOCUMENTS 6,559,527 B2   5/2003   Brofman et al.
6,780,746 B2   8/2004   Kinsman et al.
(Continued)

FOREIGN PATENT DOCUMENTS

RU   2035086 C1   10/1995

OTHER PUBLICATIONS

"HotRod QFN Package PCB Attachment", Texas Instruments, Application Report, SLUA715—May 2014, 11 pages.
(Continued)

*Primary Examiner* — Julio J Maldonado
*Assistant Examiner* — Stanetta D Isaac
(74) *Attorney, Agent, or Firm* — Dawn Jos; Charles A. Brill; Frank D. Cimino (57) ABSTRACT

In one instance, a semiconductor package includes a lead frame and a semiconductor die mounted to the lead frame via a plurality of bumps that are shaped or tapered. Each of the plurality of bumps includes a first end connected to the semiconductor die and an opposing, second end connected to the lead frame. The first end has an end surface area A1. The second end has an end surface area A2. The end surface area A1 of the first end is less than the end surface area A2 of the second end. Other aspects are disclosed.

15 Claims, 9 Drawing Sheets

FIG. 2B

Related U.S. Application Data on Oct. 5, 2017, provisional application No. 62/568,333, filed on Oct. 5, 2017.

(51) Int. Cl.
  *H01L 23/495* (2006.01)
  *H01L 21/48* (2006.01)
  *H01L 21/56* (2006.01)

(52) U.S. Cl.
  CPC ........ *H01L 23/49586* (2013.01); *H01L 24/13* (2013.01); *H01L 24/17* (2013.01); *H01L 23/4951* (2013.01); *H01L 23/49562* (2013.01); *H01L 24/03* (2013.01); *H01L 24/05* (2013.01); *H01L 24/11* (2013.01); *H01L 24/81* (2013.01); *H01L 2224/0345* (2013.01); *H01L 2224/03452* (2013.01); *H01L 2224/03912* (2013.01); *H01L 2224/0401* (2013.01); *H01L 2224/05147* (2013.01); *H01L 2224/05666* (2013.01); *H01L 2224/1111* (2013.01); *H01L 2224/1147* (2013.01); *H01L 2224/11622* (2013.01); *H01L 2224/13012* (2013.01); *H01L 2224/13013* (2013.01); *H01L 2224/13014* (2013.01); *H01L 2224/13016* (2013.01); *H01L 2224/13082* (2013.01); *H01L 2224/13111* (2013.01); *H01L 2224/13147* (2013.01); *H01L 2224/16055* (2013.01); *H01L 2224/16058* (2013.01); *H01L 2224/16245* (2013.01); *H01L 2224/16501* (2013.01); *H01L 2224/1703* (2013.01); *H01L 2224/17515* (2013.01); *H01L 2224/32245* (2013.01); *H01L 2224/73204* (2013.01); *H01L 2224/81801* (2013.01); *H01L 2224/94* (2013.01); *H01L 2924/014* (2013.01); *H01L 2924/0105* (2013.01); *H01L 2924/01047* (2013.01); *H01L 2924/3656* (2013.01)

(56) References Cited

U.S. PATENT DOCUMENTS

| | | | |
|---|---|---|---|
| 7,045,893 | B1 | 5/2006 | Paek et al. |
| 7,329,957 | B2 | 12/2008 | Sakano et al. |
| 8,993,376 | B2 | 3/2015 | Camacho et al. |
| 9,219,025 | B1 | 12/2015 | Lee et al. |
| 9,337,154 | B2 | 10/2016 | Miao et al. |
| 2007/0132047 | A1* | 6/2007 | Kuisma ............ B81B 7/02 257/415 |
| 2008/0224283 | A1* | 9/2008 | Pu ............ H01L 23/3107 257/673 |
| 2011/0111562 | A1 | 5/2011 | San Antonio et al. |
| 2012/0068334 | A1 | 3/2012 | Migita et al. |
| 2016/0322322 | A1 | 11/2016 | Utsunomiya |

OTHER PUBLICATIONS

PCT International Search Report for International Application No. PCT/US 2018/054517, dated Jan. 31, 2019, 2 pages.

Patent Cooperation Treaty Search Report, PCT/US2018/054392, dated Jan. 24, 2019, 3 pages.

* cited by examiner

SHAPED INTERCONNECT BUMPS IN SEMICONDUCTOR DEVICES

CROSS-REFERENCE TO RELATED APPLICATION

This application claims priority to and the benefit of U.S. Provisional Application Ser. No. 62/568,330, titled, "High Power Density Leadframes," filed Oct. 5, 2017, U.S. Provisional Application Ser. No. 62/568,331, titled, "High Power Density Packages," filed Oct. 5, 2017, and U.S. Provisional Application Ser. No. 62/568,333, titled, "Pre-Molded High Power Density Leadframes," filed Oct. 5, 2017, all of which are incorporated herein for all purposes.

BACKGROUND

This relates generally to semiconductor devices, and more particularly to shaped interconnect bumps in semiconductor devices.

In some types of semiconductor packages, a semiconductor die is directly mounted to a leadframe via a plurality of interconnect bumps or posts. The plurality of interconnect bumps electrically connects the semiconductor die to the leadframe. The plurality of interconnect bumps may include both signal bumps and power bumps. The signal bumps may generally focus on transmitting electrical signals between the semiconductor die and the leadframe. The power bumps may generally focus on transmitting the bulk of the power between the leadframe and the semiconductor die. As the density of connections increases, the interconnectivity has become more challenging.

SUMMARY

In one aspect, a semiconductor package includes a lead frame and a semiconductor die mounted to the lead frame via a plurality of bumps. Each of the plurality of bumps includes a first end connected to the semiconductor die and an opposing, second end connected to the lead frame. The first end has an end surface area A1. The second end has an end surface area A2. The end surface area A1 of the first end is less than the end surface area A2 of the second end.

In one aspect, a semiconductor package includes a leadframe, a semiconductor die mounted to the lead frame, and a plurality of bumps electrically connecting the semiconductor die and the lead frame. The bumps have a longitudinal length extending from a first end to an opposing, second end. The first end is connected to the semiconductor die and the second end is connected to the lead frame. The first end has a lateral width W1 orthogonal to the longitudinal length that is less than a lateral width W2 of the second end.

According to an aspect, a method of forming a plurality of tapered bumps on a die for mounting the die to a lead frame in a semiconductor package includes depositing a seed material on a wafer, depositing a photoresist on the seed material, masking the photoresist according to a pattern with bump sites, and overexposing the masked photoresist to form a plurality of tapered sites therein. Each tapered site has a first end closest to the wafer and a second end further from the wafer. The method further includes disposing one or more metals into the plurality of tapered sites and removing the photoresist to form the plurality of tapered bumps. Each tapered bump of the plurality of tapered bumps has a first surface area A1 at a first end closest to the wafer and has a second end surface area A2 at a second end further from the wafer. The first end of the tapered bump abuts the wafer and the first surface area A1 is less than the second surface area A2.

According to an aspect, a method of electrically coupling a semiconductor die to a lead frame includes forming a plurality of tapered bumps on the die, such that each of the plurality of tapered bumps has a first end surface area A1 at a first end closest to the die and a second end surface area A2 at a second opposing end. The first end has an end surface area A1 that is less than the second end surface area A2. The first end is attached to the die. The method further includes soldering the second end of the plurality of tapered bumps to the lead frame. Other aspects are disclosed herein.

DETAILED DESCRIPTION

Some semiconductor packages are configured such that a semiconductor die is directly mounted to a leadframe via a plurality of interconnect bumps (also referred to at times as posts or pillars). This type of packaging may provide improved electrical and thermal performance over other types of leaded packages that use wire bonding. Moreover, by eliminating the wire bonds that connect the semiconductor die to the leadframe, package parasitic can be reduced.

However, semiconductor dies generally have a smaller available surface area for connecting to the interconnect bumps, or bumps, as compared to leadframes. And with the increased proliferation and functionality of electronics, it is desirable to further reduce the size of the semiconductor die. Consequently, as semiconductor dies shrink, the amount of surface area available for interconnect bump connections also shrinks. The surface area available on the semiconductor die for interconnect bumps is in some situations a limiting factor without more.

Typically, the interconnect bumps have had a uniform, cylindrical shape; e.g., the diameter of the interconnect bump is uniform between the interconnect bump's die side and leadframe side. Thus, the interconnect bump's contact surface area at its die-connection side is the same as its contact surface area at its leadframe-connection side. Reducing the diameter of the interconnect bumps, reduces the interconnect bump's contact surface area not only on the semiconductor die but also the leadframe.

A reduction in the interconnect bump's contact surface area on the leadframe tends to causes the power and current density to increase at the junction between the interconnect bump and the leadframe. Increasing the power and current densities may result in higher temperatures and premature failures due to electromigration at the junction between the interconnect bump and the leadframe. Solder materials used to attach the interconnect bumps to the leadframe may further contribute to electromigration issues due to the properties of the solder material used in attaching the interconnect bumps to the leadframe.

Miniature-type packages, e.g., WCSP and QFN, may further be electromigration limited due to their small size. In other words, the power and current density at the junction between the interconnect bump and the leadframe may be even greater due to the smaller size of the miniature-type packages.

The interconnect bumps herein and methods address at least some of the above limitations. In one arrangement, the interconnect bumps herein have a narrower first end (e.g., smaller diameter) on the die end and a wider (e.g., larger diameter) at the leadframe. The interconnect bumps reduce the size of the bump on the die-side and increases the area on the solder or leadframe side.

Figure 1:
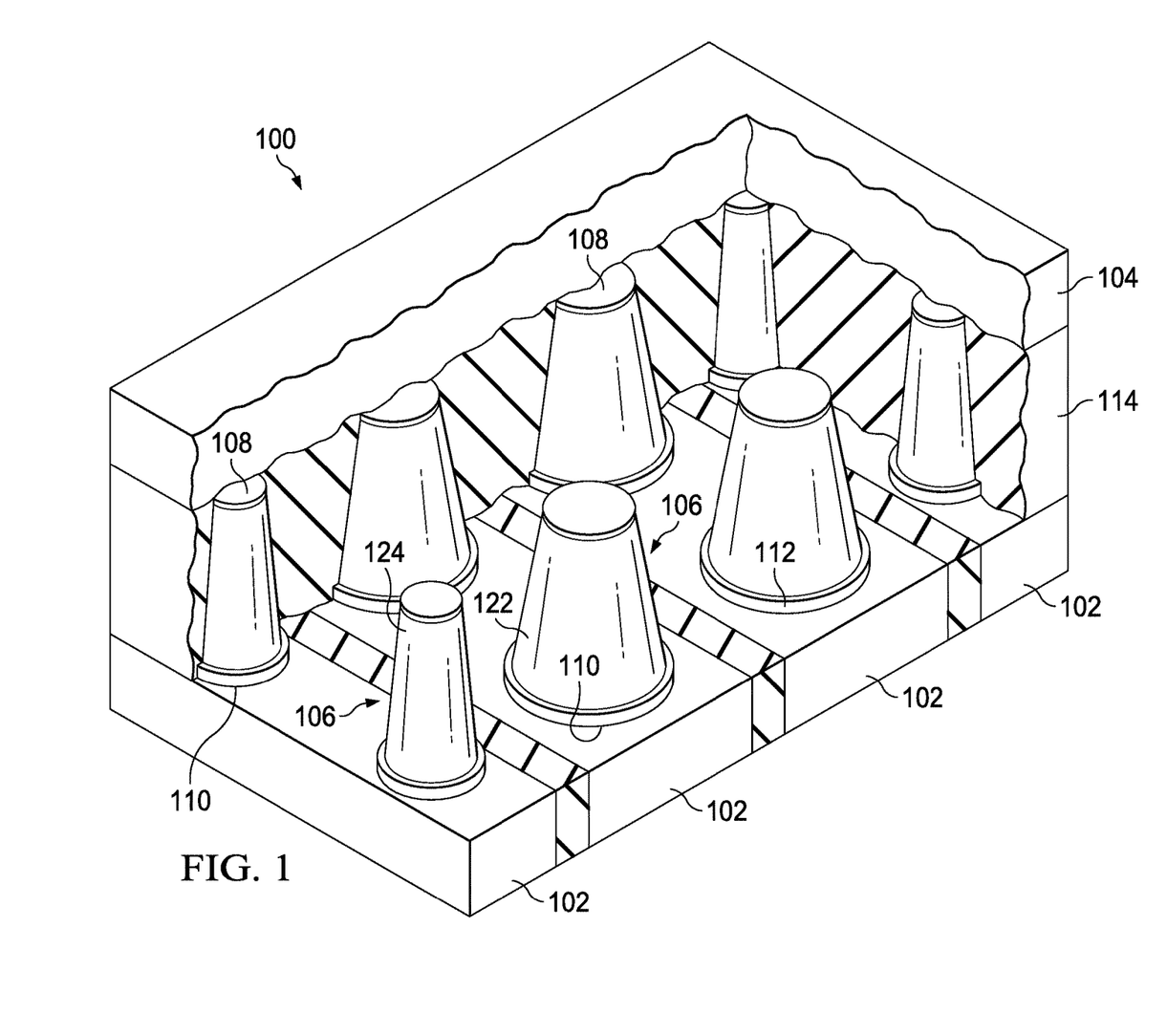
FIG. 1 is a schematic, perspective view of a portion of an illustrative semiconductor package.
Figure 2A:
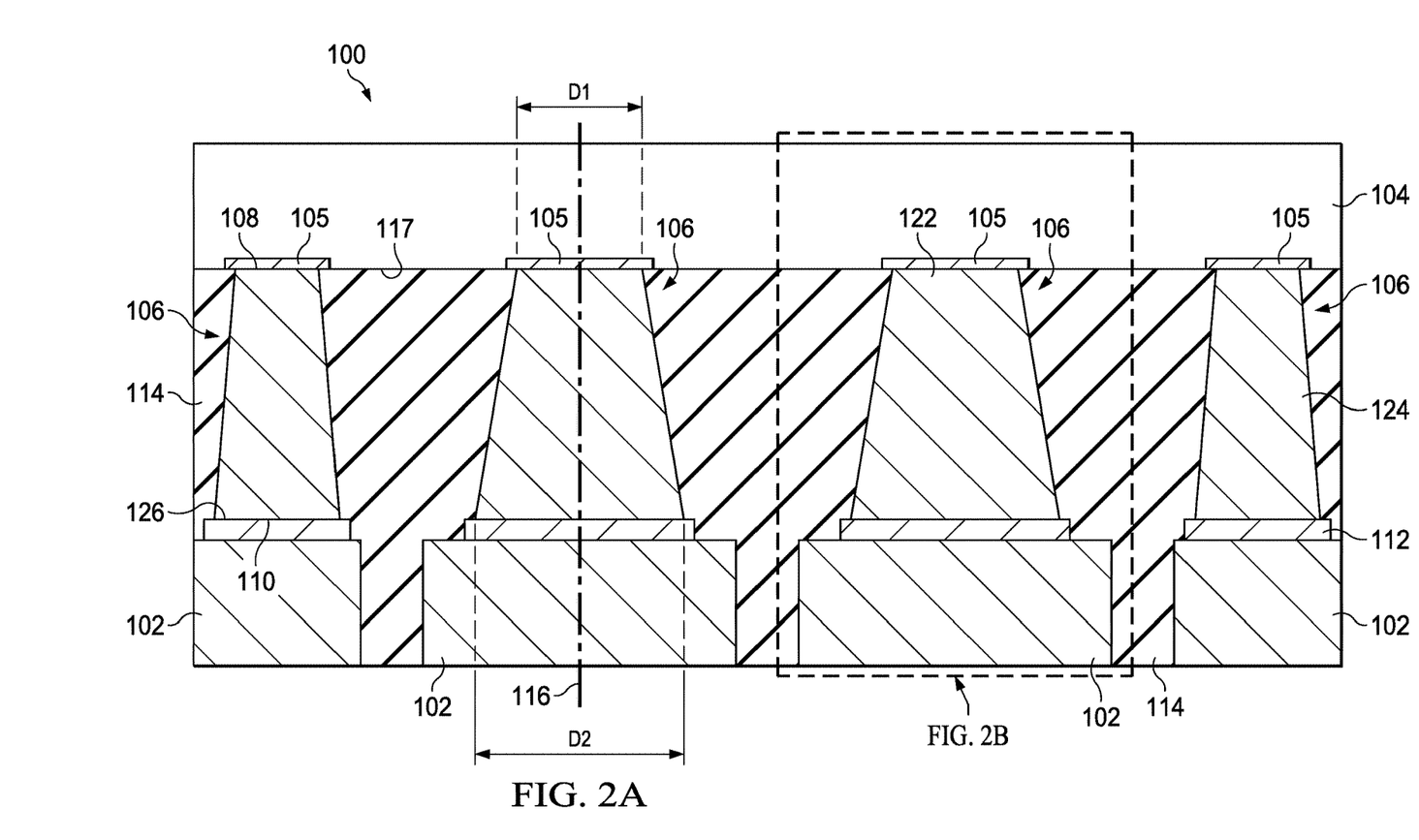
FIG. 2A is a schematic, front view of the illustrative semiconductor package of FIG. 1.
Figure 2B:
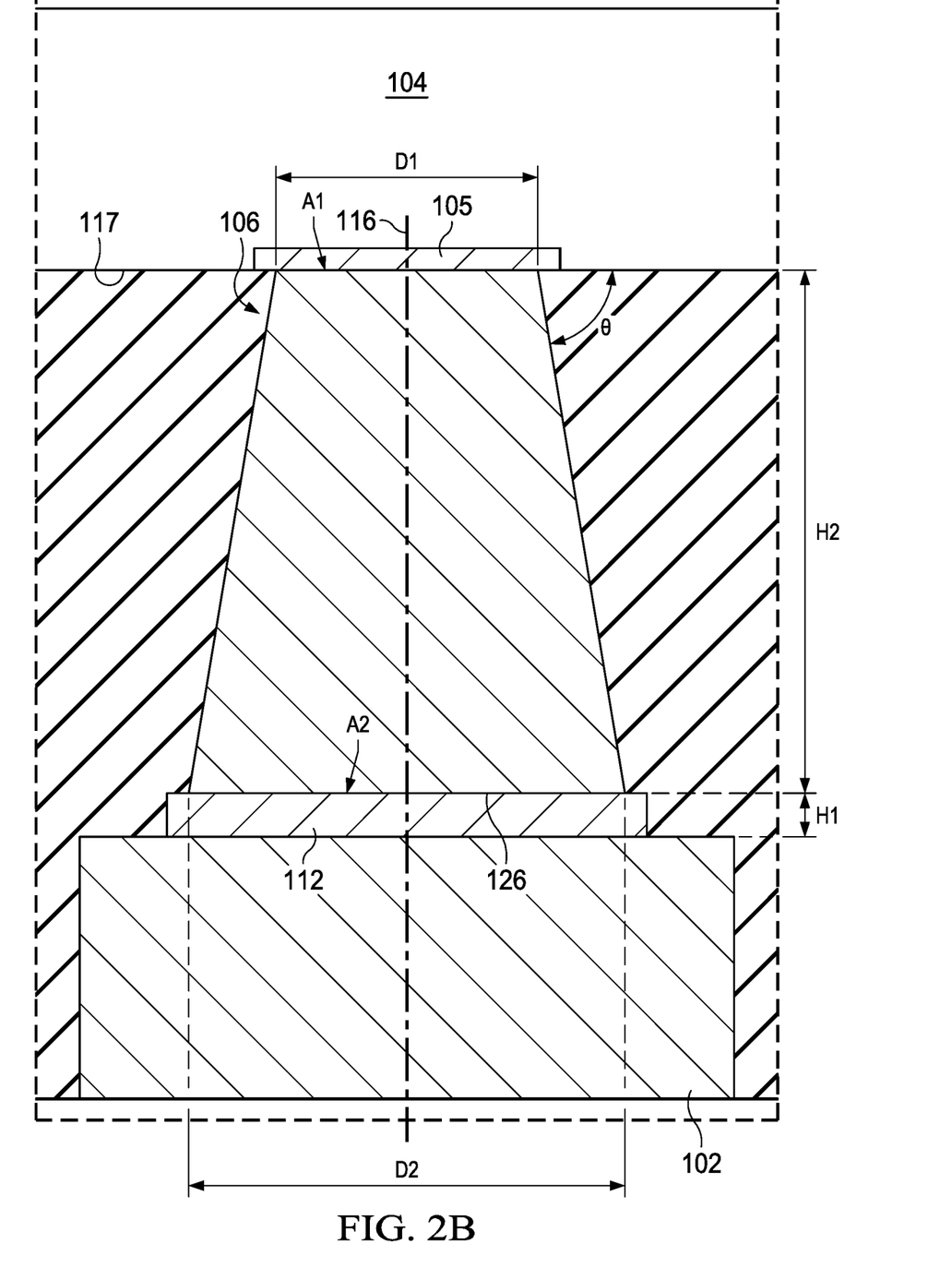
FIG. 2B is a schematic, detailed view of a portion of the illustrative semiconductor package of FIG. 2A.

Referring now primarily to FIGS. 1 through 2B, a semiconductor package 100 is presented. The semiconductor package 100 includes a leadframe 102, a semiconductor die 104 (singulated or still a portion of semiconductor wafer) and a plurality of interconnect bumps 106, or bumps, that electrically couple the semiconductor die 104 to the leadframe 102. A portion of the die 104 and molding compound 114 have been removed in FIG. 1 to better show the bumps 106.

In some aspects, the leadframe 102 is formed of a metal. The plurality of bumps 106 includes a first end 108, or die-end, connected to the semiconductor die 104 and an opposing, second end 110, or leadframe-end, connected to the leadframe 102. The bumps 106 are coupled at one end to a plurality of copper on anything (COA) elements 105.

While some other bumps may be present, the plurality of bumps 106 have an angled shape, such that the second end 110 of the plurality of bumps 106 is larger than the first end 108 of the plurality of bumps 106. The bumps 106 are not cylindrical members. As such the lateral cross section or end at the first end 108 is smaller than the lateral cross section or end at the second end 112. Shaping the plurality of bumps 106 to allow the second end 110 of the plurality of bumps 106 to be larger than the first end 108 of the plurality of bumps 106 allows the second end 110 to take advantage of the larger end surface area available on the leadframe 102, while keeping the first end 108 small enough to fit on the semiconductor die 104. Increasing the size of the second end 110 of the plurality of bumps 106, may help reduce current and power densities flowing between the second end 110 of the plurality of bumps 106 and the leadframe 102. Aspects of the plurality of bumps 106 will be discussed in more detail below.

The semiconductor package 100 further includes a solder material 112, e.g., SnAg, disposed between the plurality of bumps 106 and the leadframe 102. The solder material 112 is used to attach the second end 110 of the plurality of bumps 106 to the leadframe 102. In some aspects, the solder material 112 may be formed of a tin-silver (SnAg) alloy. Other types of solders may be used. In some aspects, the solder material 112 may have a height H1 (FIG. 2B) of between approximately 20 to 30 μm.

A solder-bump interface 126 is formed between the second end 110 of the plurality of bumps 106 and the solder material 116. The solder-bump interface 126 is subject to electromigration issues, including void propagation, in some instances. Increased current densities can contribute to breakdown of the solder-bump interface 126, which can create reliability issues and prevent the placing of some types of active circuits in the semiconductor die 104 adjacent to the plurality of bumps 106. By increasing the size of the second end 110 of the plurality of bumps 106, the current densities flowing through the solder-bump interface 126 may be decreased, thereby increasing the life of the solder-bump interface 126. Likewise, increasing the size of the second end 110 of the plurality of bumps 106 may increase the efficiency of the current exchange, which may result in a decrease in heat output at the solder-bump interface 126.

In some aspects, the semiconductor package 100 further includes the molding compound 114 (FIGS. 2A and 2B) to protect the components of the semiconductor package 100. The molding compound 114 may provide structural support to the semiconductor package 100 and may cover at least a portion of the leadframe 102, the semiconductor die 104, the plurality of bumps 106 or any combination thereof. In some aspects, the molding compound 114 may further fill-in the gaps between components of the semiconductor package 100, such as, for example, between the plurality of bumps 106. In yet some aspects, the molding compound 114 is an epoxy, polymer or other insulating material.

Still referring primarily to FIGS. 1 through 2B, the plurality of interconnect bumps 106 extend between the semiconductor die 104 on a first end and the leadframe 102 on a second end along a longitudinal axis 116 (FIGS. 2A and 2B), or centerline. The plurality of interconnect bumps 106 may also be referred to as pillars or bumps. Each of the plurality of interconnect bumps 106 has a angled shape on the sidewall in the direction of the longitudinal axis 116. The first end 108 of each of the plurality of interconnect bumps 106 has a width or diameter D1 that is less than a width or a diameter D2 of the second end 110. The first end 108 of each of the plurality of interconnect bumps 106 also has a end surface area A1 that is less than a end surface area A2 of the second end 110 of the plurality of interconnect bumps 106. In other words, the first end 108 of the plurality of interconnect bumps 106 is smaller than the second end 110 of the plurality of interconnect bumps 106. In one instance, A1 is at least 10 percent less than A2. In one instance, A2 is at least twice A1.

In some aspects, each of the plurality of interconnect bumps 106 is tapered from the second end 110 to the first end 108, such that each of the plurality of interconnect bumps 106 decreases in size from the second end 110 towards the first end 108. In some aspects, the end surface area A2 of the second end 110 may be greater than 1 and up to 3 times the size of the end surface area A1 of the first end 108. In yet some aspects, the end surface area A2 of the second end 110 may be approximately 2 times the size of the end surface area A1 of the first end 108. The ratio between, the end surface area A2 of the second end 110 and the end surface area A1 of the first end 108 may be modified based on the available surface area on the semiconductor die 104 and the leadframe 102 for interconnect bump connections.

While FIGS. 1 through 2B illustrate the second end 110 of the plurality of interconnect bumps 106 being larger than the first end 108 of the plurality of interconnect bumps 106, it should be appreciated that there may be some instances where it be beneficial for the second end 110 of the plurality of interconnect bumps 106 to be smaller than the first end 108 of the plurality of interconnect bumps 106. Thus, in some aspects, the surface area A2 of the second end 110 of the plurality of interconnect bumps 106 may be less than 1 times the size of the surface area A1 of the first end 108. In yet some aspects, the surface area A2 of the second end 110 of the plurality of interconnect bumps 106 may be approximately 0.75 times the size of the surface area A1 of the first end 108.

In some aspects, the plurality of interconnects bumps 106 has a truncated-cone or frustum shape along the longitudinal axis 116 with a circular cross-sectional shape or other curvilinear shape transverse, or orthogonal, to the longitudinal axis 116. In yet some aspects, the plurality of interconnect bumps 106 has a angled shape along the longitudinal axis 116 with an oval cross-sectional shape transverse or lateral to the longitudinal axis 116. The plurality of interconnect bumps 106 may take a number of angled shapes along the longitudinal axis 116 so long as the surface area A2 of the second end 110 is different than the surface area A1 of the first end 108.

The plurality of interconnect bumps 106, in some aspects, has a side wall with a slope θ of approximately 70 degrees or less relative to a surface 117 of the semiconductor die 104. In one arrangement, the slope θ is between 45 and 90 degrees. The plurality of interconnect bumps 106 has a height H2 (FIG. 2B), or longitudinal dimension. In some aspects, the height H2 of the plurality of interconnect bumps 106 is between approximately 35 and 75 μm. In yet some aspects, the height H2 of the plurality of interconnect bumps 106 is approximately 50 μm. The plurality of interconnect bumps 106 is formed of a conductive material. In some aspects, the plurality of interconnect bumps 106 is formed of copper (Cu) or a copper alloy.

The angle θ may be selected to achieve a desired end surface areas relationship. In one illustrative arrangement, it is desired that the end surface area A2 be twice end surface area A1. Assuming that the bump is circular in lateral cross section, has a height along the centerline 116 of h, has a lateral width or diameter at the first end of b and if the diameter at the second end is given by b+2a then the following may be used to find the angle θ: Tan (90−θ)=a/h; Tan(θ)=h/a; a=h/Tan(θ). Again assuming circular cross section, then to double the area: b+2a=square root 2*b. b+2(h/Tan(θ))=square root 2*b. h/Tan(θ)=½ b (square root 2−1)= 0.2071*b. Tan(θ)=h/(0.2071*b). θ=a Tan (h/0.2071 b). So if h=50 microns and b=100 microns, then θ would be 67 degrees and a=20.7 microns.

Still referring primarily to FIGS. 1 through 2B, in some aspects, the plurality of interconnect bumps 106 may include a plurality of power bumps 122 and a plurality of signal bumps 124. The plurality of power bumps 122 is configured to transmit at least the bulk of the power transfer between the semiconductor die 104 and the leadframe 102. The plurality of signal bumps 124 is configured to transmit electrical signals between the semiconductor die 104 and the leadframe 102. In some aspects, the plurality of power bumps 122 is larger than the plurality of signal bumps 124 with respect to average cross-sectional areas (lateral cross section). The plurality of power bumps 122 may be larger than the plurality of signal bumps 124 because the current exchanged through the plurality of power bumps 122 tends to be larger than the current exchanged through the plurality of signal bumps 124.

In some aspects, at least some of the plurality of power bumps 122 is tapered or otherwise has an angled shape in longitudinal cross section. In yet some aspects, at least some of the plurality of power bumps 122 and at least some of the plurality of signal bumps 124 are tapered or otherwise have an angled shape. The plurality of signal bumps 124 and power bumps 122 are formed as previously described.

Figure 3A:
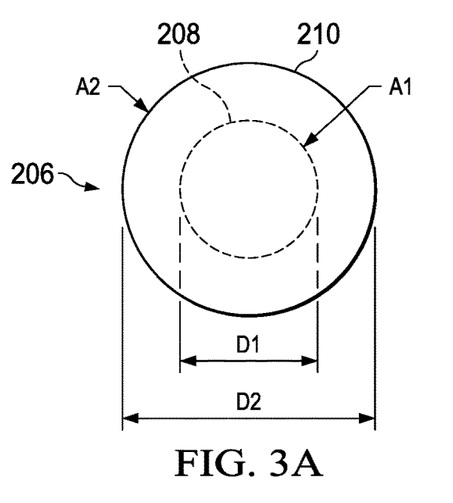
FIG. 3A is a schematic view of one end of an illustrative shaped interconnect bump.
Figure 3B:
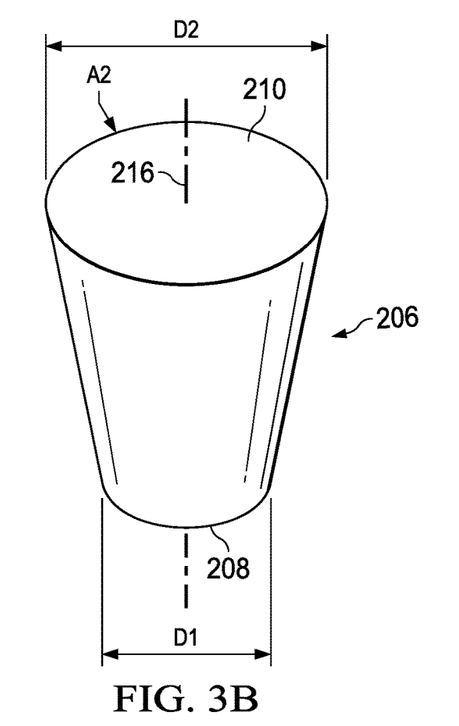
FIG. 3B is a schematic, perspective view of the shaped interconnect bump of FIG. 3A.

Referring now primarily to FIGS. 3A and 3B, an interconnect bump 206, according to some aspects, is presented. The interconnect bump 206 may be one of the plurality of interconnect bumps 106 of FIG. 1. FIG. 3A is a schematic end (second end with reference to FIG. 1) view of the interconnect bump 206; a first end of the interconnect bump 206 is shown via hidden lines. FIG. 3B is a schematic, perspective view of the interconnect bump 206 of FIG. 3A. In some aspects, the interconnect bump 206 may be referred to as having a truncated-conical shape or frustum or frustoconical shape. The interconnect bump 206 has a circular cross-sectional shape transverse to a longitudinal axis 216 (or centerline), i.e., lateral cross section, but other shapes (elliptical, square, polygons, etc.) may be used. In some arrangements, the lateral cross section is curvilinear.

The interconnect bump 206 has a first end 208 and an opposing, second end 210. The first end 208 of the interconnect bump 206 is for attaching to a semiconductor die, such as the semiconductor die 104 shown in FIG. 1. The second end 210 of the interconnect bump 206 is for attaching to a leadframe or other conductive material, such as the leadframe 102 shown in FIG. 1. The interconnect bump 206 has a tapered shape seen best in longitudinal cross section, such that the interconnect bump 206 decreases in size from the second end 210 towards the first end 208. As shown well in FIG. 3B, the first end 208 of the interconnect bump 206 has a diameter D1 that is smaller than a diameter D2 of the second end 210 of the interconnect bump 206. The first end 208 of the interconnect bump 206 also has a first end surface area A1 ($\pi*(D1/2)^2$) that is smaller than a second surface area A2 ($\pi*(D2/2)^2$) of the second end 210 of the interconnect bump 206. Both the first end 208 and the second end 210 of the interconnect bump 206 have circular cross-sectional shapes in one arrangement.

Figure 4:
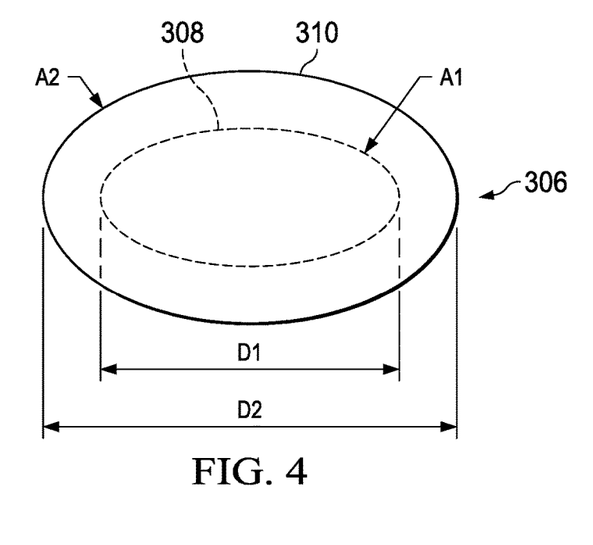
FIG. 4 is a schematic view of another illustrative shaped interconnect bump.

Referring now primarily to FIG. 4, a schematic view of a second end of an interconnect bump 306, according to some aspects, where a first end (narrower end) of the interconnect bump 306 is shown via hidden lines. The interconnect bump 306 differs from the interconnect bump 206 of FIGS. 3A-3B in that the interconnect bump 306 has an oval cross-sectional shape, which is transverse or orthogonal to the longitudinal axis (analogous to axis 116, 216) extending into the page. The interconnect bump 306 has a first end 308 and an opposing, second end 310. The first end 308 of the interconnect bump 306 is for attaching to a semiconductor die, such as the semiconductor die 104 shown in FIG. 1. The second end 310 of the interconnect bump 306 is for attaching to a leadframe, such as the leadframe 102 shown in FIG. 1.

The interconnect bump 306 has a tapered shape along its longitudinal dimension, such that the interconnect bump 306 decreases in size from the second end 310 towards the first end 308. The first end 308 of interconnect bump 306 has a width (long dimension in lateral cross section) D1 that is smaller than a width (long dimension in lateral cross section) of the second end 310 of the interconnect bump 306. The first end 308 of interconnect bump 306 also has a first surface area A1 that is smaller than a second surface area A2 of the second end 310 of the interconnect bump 306. In one instance, A1 is less than 10% of A2. In one arrangement, A2 is at least two times A1. While FIG. 4 shows an oval lateral cross section, it should be understood that other cross sectional shapes may be used, e.g., curvilinear, circular, polygonal, square, circular, oval, rectangular, and polygons with rounded corners.

Figure 5:
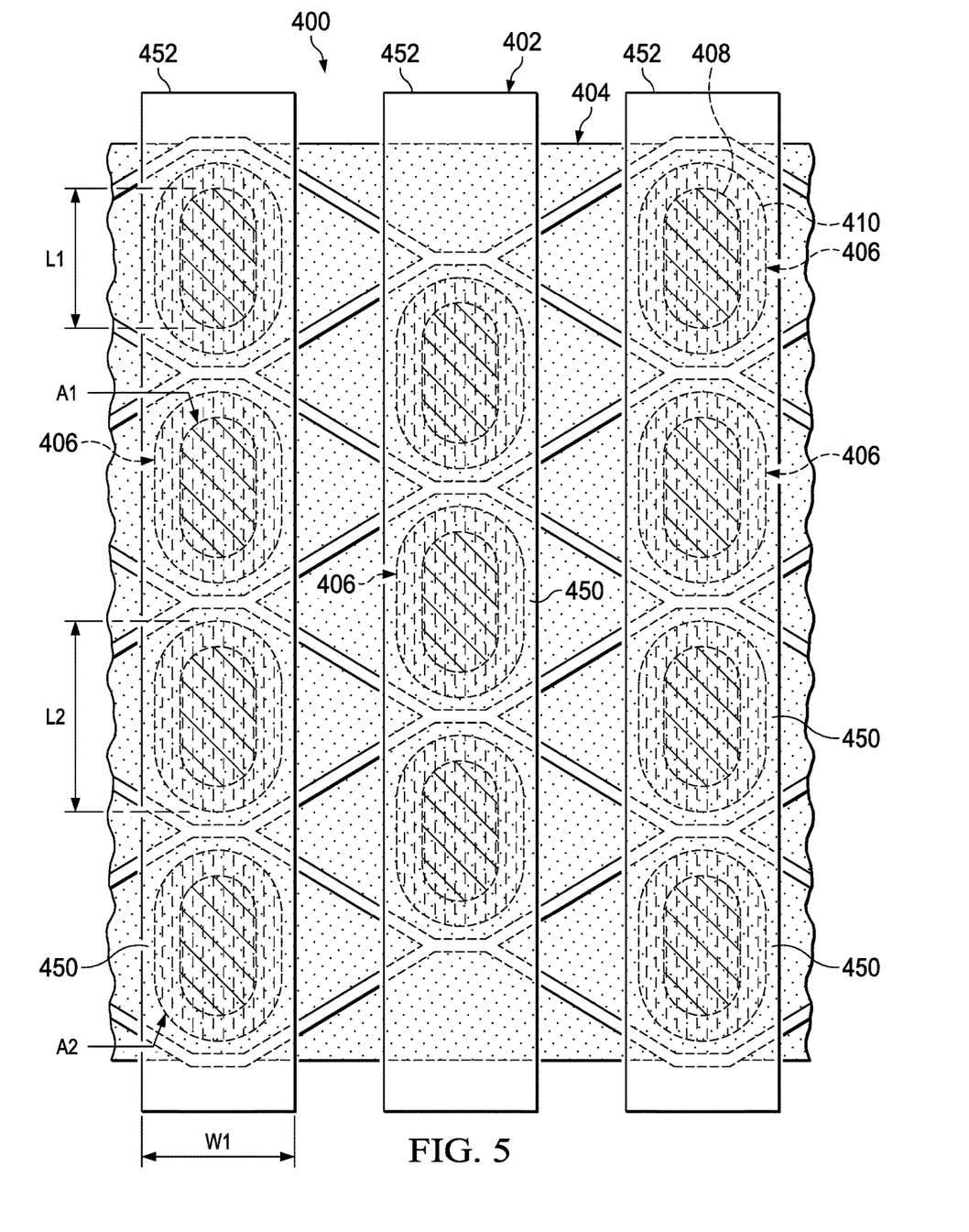
FIG. 5 is a schematic plan view of a portion of an illustrative semiconductor package.

Referring now primarily to FIG. 5, a schematic plan view of a portion of a semiconductor package 400, according to an illustrative arrangement, is shown. The semiconductor package 400 includes a leadframe 402 connected to a semiconductor die 404 via a plurality of shaped, angled interconnect bumps 406. The semiconductor package 400 provides an illustrative example of how interconnect bumps, such as the plurality of shaped, angled interconnect bumps 406 shown herein, can be configured based on the size or arrangement of the components within the semiconductor package 400, such as the semiconductor die 404 and the leadframe 402. The semiconductor die 404, for example, may be a 250 to 100 nanometer process. The semiconductor die 404 has landing sites 450 for connecting to the interconnect bumps 406. In some aspects, the landing sites 450 on the semiconductor die 404 may have a width or diameter of between approximately 25 and 400 microns. The leadframe 402, for example, may have landing sites 452 or element with a section width W1 between approximately 35 and 600 microns.

A first end 408 of the interconnect bump 406 is connected to the semiconductor die 404, and a second end 410 of the interconnect bump 406 is connected to the leadframe 402. The first end 408 has a surface area A1 with a length L1 and the second end 410 has a surface area A2 and a length L2. The surface area A1 and the width W1 of the first end 408 of the interconnect bump 406 is typically limited, at least partially, by the size of the landing sites 450 on the semiconductor die 404. The landing sites 450 are areas on the die for receiving at least a portion of the interconnect bump 406. The landing sites 452 on the leadframe 402, however, are typically larger than the landing sites 450 on the semiconductor die 404 and, therefore, can accommodate a larger interconnect bump or portion of an interconnect bump 406. Thus, the plurality of interconnect bumps 406 is shaped such that surface area A2 and the width W2 of the second end 410, which is connected to the leadframe 402, is larger than the surface area A1 and the width W1 of the first end 408, which is connected to the semiconductor die 404. In this way, the plurality of interconnect bumps 406 may take advantage of the larger surface area available on the leadframe 402. The shape of the plurality of shaped, angled interconnect bump 406, e.g., the size of the first end 408 and the second end 410 of the plurality of interconnect bump 406, may be modified based on the available size of the landing sites 450 on the semiconductor die 404 and the landing sites 452 on the leadframe 402. The plurality of shaped, interconnect bumps 406 is angled or otherwise nonuniform such that the end (the first end 408) that is configured to be connected to the semiconductor die 404 has a smaller surface area than the end (the second end 410) configured to be connected to the leadframe 402.

Figure 6:
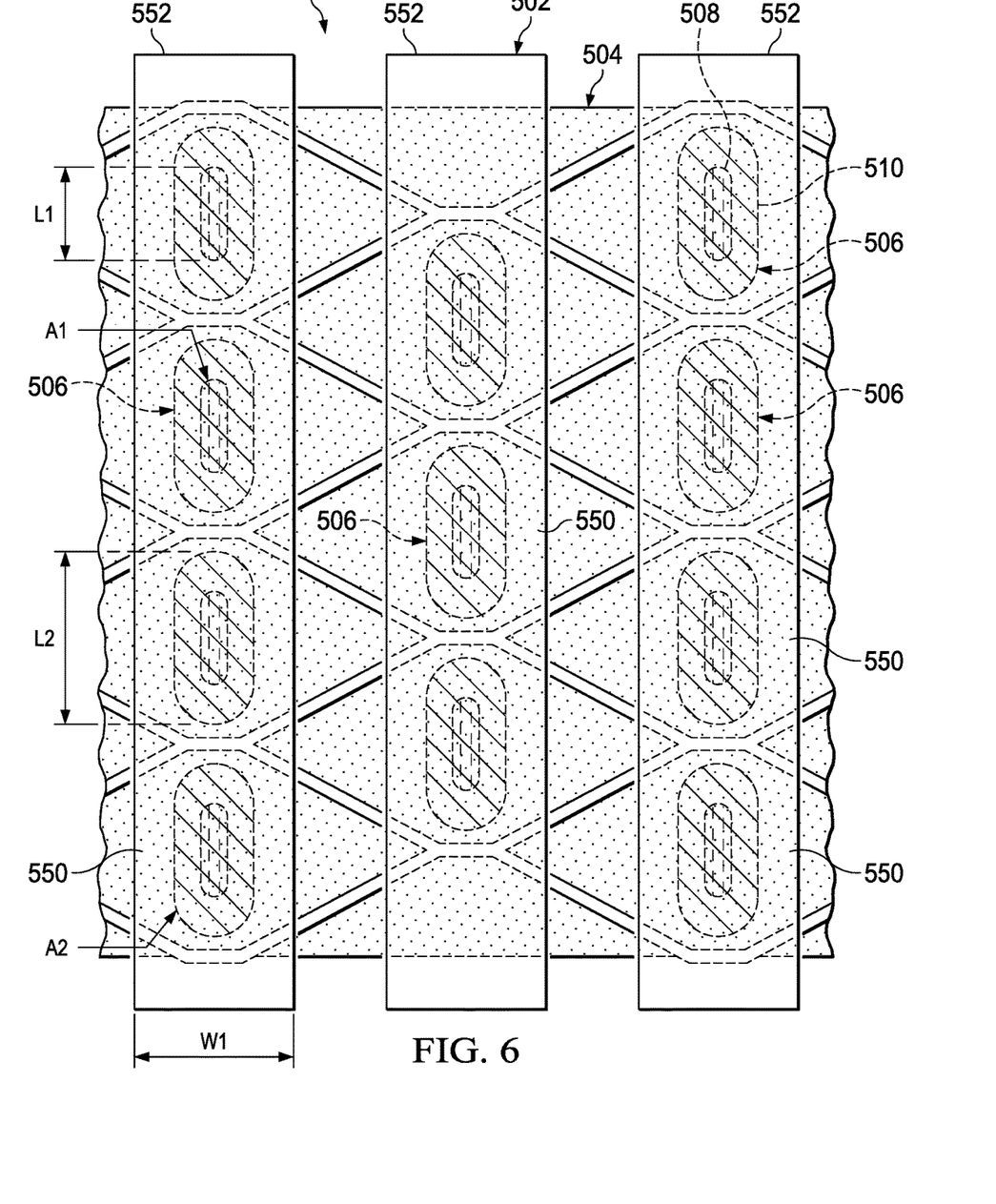
FIG. 6 is a schematic plan view of a portion of an illustrative semiconductor package.

Referring now primarily to FIG. 6, a schematic view of a portion of a semiconductor package 500, according to an illustrative arrangement, is presented. The semiconductor package 500 includes a leadframe 502 connected to a semiconductor die 504 via a plurality of shaped, angled interconnect bumps 506. The semiconductor package 500 is similar to the semiconductor package 400 illustrated in FIG. 5, except that the semiconductor die 504 is smaller than the semiconductor die 404 illustrated in FIG. 5 and, consequently, has smaller landing sites 550. The shaped, angled plurality of interconnect bump 506 have been configured based, at least partially, on the size of the landing sites 550 on the semiconductor die 504. The semiconductor die 504, for example, may be a sub-100 nanometer process generation die. In some aspects, the landing sites 550 on the semiconductor die 504 may have a width of between approximately 0.3×0.3 mm and 10×10 mm. In some aspects, landing sites 552 on the leadframe 502 have a width W1 that may be similar or the same as the width W1 of the landing sites 452 on the leadframe 402 of FIG. 5. Thus, the landing sites 552 on the leadframe 502 may be the same size as the landing sites 452 on the leadframe 402 of FIG. 5. The shape of the plurality of shaped, angled interconnect bumps 506, e.g., the size of the first end 508 (die-side) and the second end 510 (leadframe-side) of the plurality of interconnect bump 506, may be modified based on the available size of the landing sites 550 on the semiconductor die 504 and the landing sites 552 on the leadframe 502.

Figure 7A:
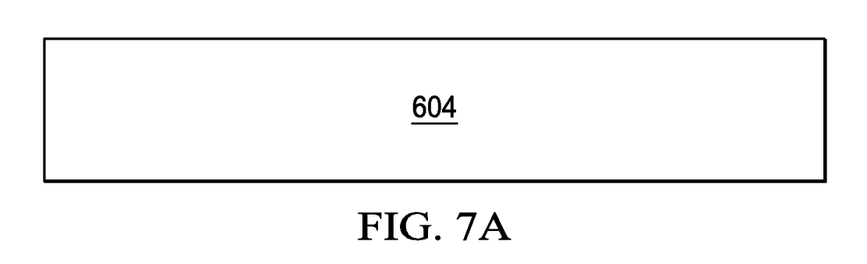
FIGS. 7A-7G are schematic, diagrams in cross section showing process steps for forming shaped interconnect bumps on a semiconductor wafer.
Figure 7B:
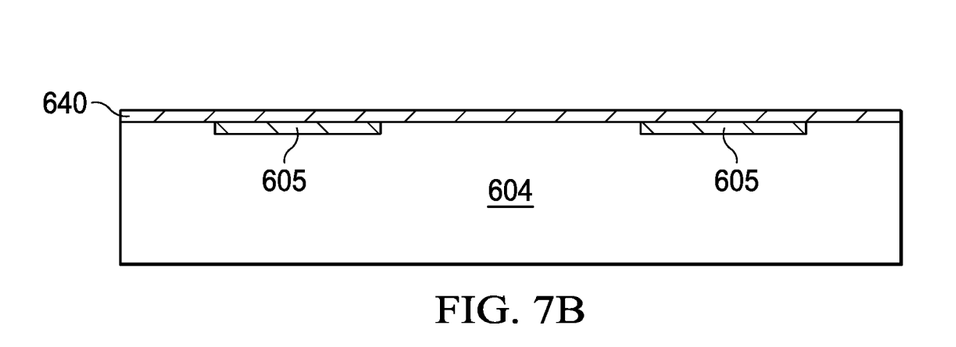

Referring now primarily to FIGS. 7A-7G, schematic, diagrams representing process steps for forming portions of a semiconductor package 600 (analogous in most respects to semiconductor packages 100, 400, 500) are presented. Referring initially to FIGS. 7A-7B, a seed layer 640 (FIG. 7B) is placed on the semiconductor wafer 604, or what will become a die after singulation, through a suitable formation process. The wafer 604 has a plurality of copper on anything (COA) elements 605. In some aspects, the seed layer 640 may be placed on the semiconductor die 604 or wafer by chemical vapor deposition (CVD) or sputter deposition. In some arrangements, the seed layer 640 may comprise titanium (Ti) and titanium-tungsten (TiW).

Figure 7C:
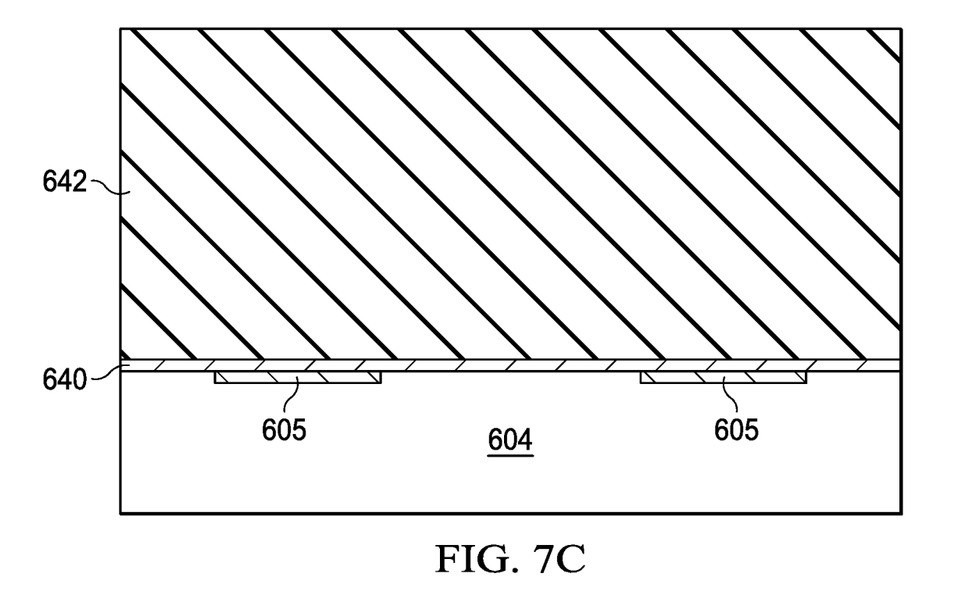

With reference now primarily to FIG. 7C, a photoresist 642 is deposited on the seed layer 640, which is over COA 605. A mask (not explicitly shown) is placed on the photoresist 642 according to a photoresist pattern. The photoresist pattern locates sites for the interconnect bumps.

In comparing FIGS. 5 and 6, it should be understood that the tapering of the bumps 406, 506 may be used to keep the leadframe 402 at the same size but then decrease the end surface area on the first side (FIG. 5) to use a smaller area on the wafer/die 504 or the bumps 406 may be used to keep the end surface area the same at the first end at the die/wafer (FIG. 6) but to enlarge the end surface area at the second end or some combination thereof.

Figure 7D:
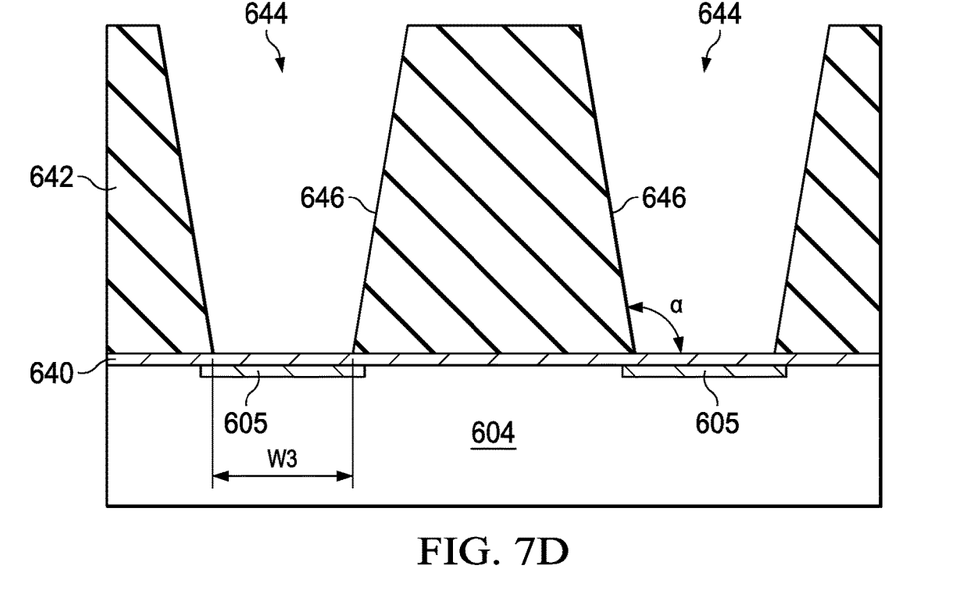

With reference now primarily to FIG. 7D, the photoresist 642 is exposed to light to form a plurality of openings 644 in the photoresist 642 in accordance with the photoresist pattern. The plurality of openings 644 extends all the way to the seed layer 640. Each of the plurality of openings 644 is defined by sloped sidewalls 646. In some aspects, the sidewalls 646 are sloped at an angle α (in FIG. 2B, θ=180−α) of approximately 110 degrees or greater. The sloped sidewalls 646 may be achieved by overexposing the photoresist 642. In some aspects, the angle α of the sidewalls 646 may be varied based on the amount of light exposure to the photoresist 642. The angle α of the sidewalls 646 may be altered based on the desired size or shape of the plurality of interconnect bump 606.

Each of the plurality of openings has a width W3 (FIG. 7D) along a bottommost (for the orientation shown) portion of the openings 644, adjacent to the seed layer 640. The width W3 of the plurality of openings 644 corresponds to the width W1 (FIG. 7E) of the first end 608 of the plurality of interconnect bump 606. In some aspects, some of the plurality of openings 644 have different sizes than others of the plurality of openings 644. For example, the width along the bottommost portion of the openings 644 may differ with the width for signal bump openings being smaller than the width for power bump openings.

Figure 7E:
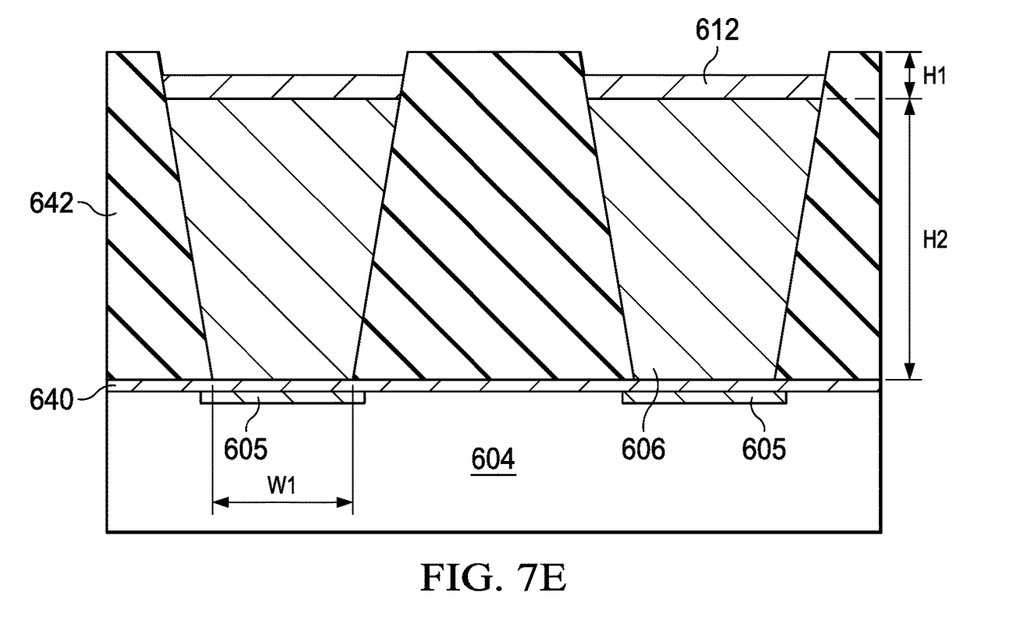
Figure 7F:
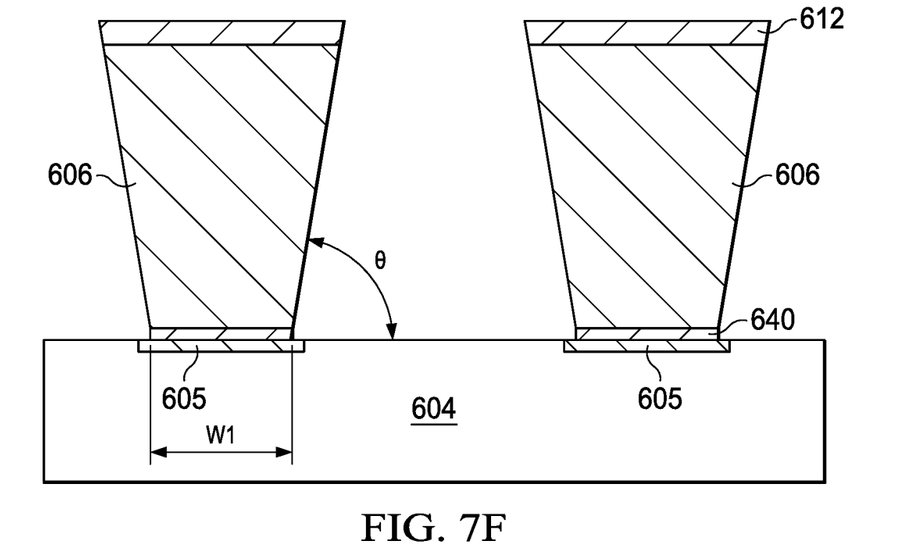

Referring now primarily to FIG. 7E, metal is deposited in the plurality of openings 644 The metal may be deposited as plate bumps of copper and solder. Then, the photoresist is removed to arrive at the stage shown in FIG. 7G.

Figure 7G:
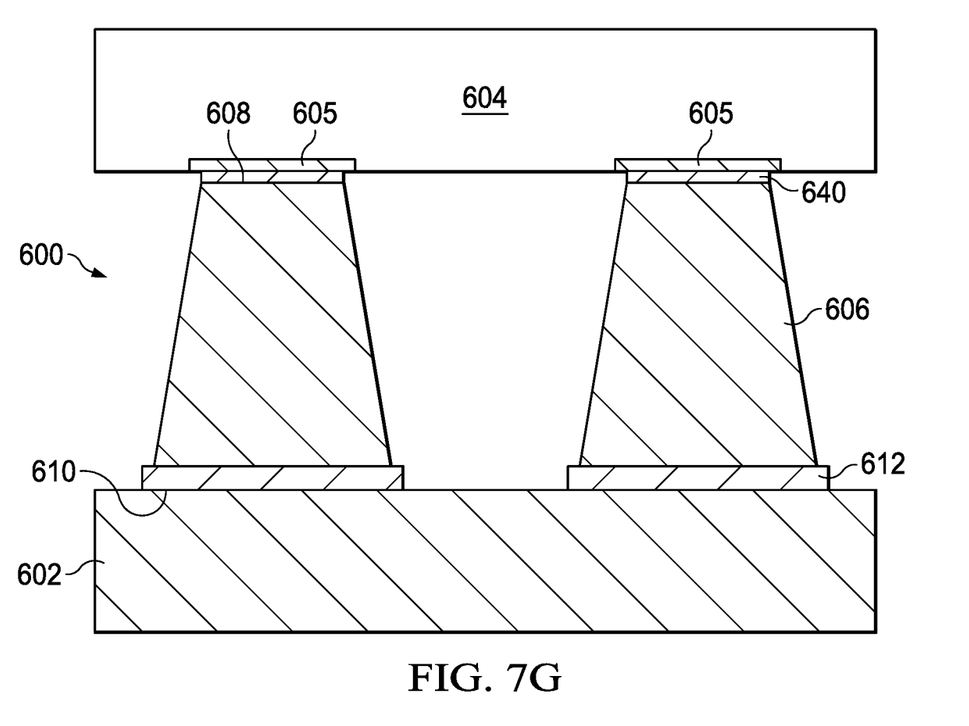

With reference now primarily to FIG. 7G, the plurality of interconnect bumps 606 is formed on the seed layer 640 on the wafer in each of the plurality of openings 644. The plurality of interconnect bump 606 take the shape of the plurality of openings 644, as at least partially defined by the sloped or angled sidewalls 646 and the width W3 (FIG. 7D) along the bottommost portion of the plurality of openings 644.

The plurality of interconnect bumps 606 may be formed by a process such as plating. The material used to form the plurality of interconnect bump 606 may be plated to a desired height. In an illustrative, nonlimiting example, the height H2 (FIG. 7E) of the plurality of bumps 606 is between approximately 35 and 75 µm. In some aspects, the plurality of interconnect bump 606 is formed of copper. In some aspects, the solder material 612 is placed on the second end 110 of the plurality of interconnect bumps 106 prior to the photoresist 142 being removed. In some aspects, the height H1 (FIG. 7E) of the solder material 112 may be between approximately 20 to 30 µm.

After the plurality of interconnect bumps 606 have been formed within the plurality of openings 644, the photoresist 642 is removed or stripped through a suitable removal process, such as ashing. Additionally, after the removal of the photoresist 642, those portions of the seed layer 640 not directly underlying the plurality of interconnect bumps 606 may be removed by a suitable removal process, such as etching.

With reference now primarily to FIG. 7G, the semiconductor die 604 may then be attached to the leadframe 602 by soldering the solder material 612 to the leadframe 602. In some aspects, the solder material 612 is placed on the second end 610 of the plurality of interconnect bumps 606 after the photoresist 642 has been removed from the semiconductor die 604. The process of attaching the semiconductor die 604 to the leadframe 602 may be referred to as flipping the semiconductor die 604.

There are many possible benefits to having shaped bumps as described herein. The shaped or non-cylindrical bumps provide smaller landing areas on the wafer/die side and a larger area on the leadframe side. This may allow for more interconnections on the wafer/die while also allowing for larger connections on the leadframe to gain efficiency. An optional polyamide (PI) or metal layer (usually copper) on top of the die after final fab process step ("METTOP") can be used between the bump and the wafer. The solder interface can be reduced and current rating increased. No additional masks are required. The overall package size may be reduced. These are only some of the possible benefits.

Modifications are possible in the described arrangements, and other arrangements are possible, within the scope of the claims.

What is claimed is:

1. A semiconductor package comprising:
   a leadframe;
   a semiconductor die mounted to the leadframe via a plurality of bumps; and
   wherein each of the plurality of bumps comprises:
   a first end connected to the semiconductor die, the first end having an end surface area A1, and
   an opposing, second end connected to the leadframe, the second end having a end surface area A2, wherein the end surface area A1 of the first end is less than the end surface area A2 of the second end.

2. The package of claim 1, wherein the end surface area A2 of the second end is at least 10 percent greater than the end surface area A1 of the first end.

3. The package of claim 1, wherein the surface area A2 of the second end is at least double the surface area A1 of the first end.

4. The package of claim 1, wherein each of the plurality of bumps is shaped as truncated cones with a large end of the truncated cone defining A2 and a narrow end of the truncated cone defining A1.

5. The package of claim 1, wherein for each of the plurality of bumps a cross-section taken orthogonally to a line going from the first end to the second end is oval or circular.

6. The package of claim 1, wherein the leadframe is metallic, and wherein the plurality of bumps is comprised of copper.

7. The package of claim 1, further comprising a solder material associated with each of the plurality of bumps and wherein the solder material is disposed between the second end of the bump and the leadframe to attach the second end of the bump to the leadframe.

8. The package of claim 1, further comprising mold compound at least partially covering the leadframe, the semiconductor die, and the plurality of bumps.

9. A semiconductor package comprising:
   a leadframe;
   a semiconductor die mounted to the leadframe; and
   a plurality of bumps electrically connecting the semiconductor die and the leadframe, the bumps having a longitudinal length extending from a first end to an opposing, second end, wherein the first end is connected to the semiconductor die and the second end is connected to the leadframe, and wherein the first end has a lateral width W1 orthogonal to the longitudinal length that is less than a lateral width W2 of the second end.

10. The package of claim 9, wherein each of the plurality of bumps is tapered between the first end and the second end.

11. The package of claim 9, wherein the first end has an end surface area A1, wherein the second end has a end surface area A2, and wherein the end surface area A1 is at least half the size of the end surface area A2.

12. The package of claim 9, wherein for each of the plurality of bumps a cross-section taken orthogonally to a line going from the first end to the second end is oval or circular.

13. The package of claim 9, further comprising a plurality of signal bumps electrically connecting the semiconductor die and the leadframe, the plurality of signal bumps having an average lateral width that is smaller than an average lateral width plurality of bumps.

14. The package of claim 13, further comprising:
   a solder material;
   wherein the solder material is disposed between the second end of the plurality of bumps and the leadframe; and
   mold compound at least partially covering the leadframe, the semiconductor die, the plurality of bumps, and the plurality of signal bumps.

15. The package of claim 9, wherein the leadframe is metallic.

* * * * *